US00RE47504E

(19) United States
(12) Reissued Patent
Nakabayashi et al.

(10) Patent Number: US RE47,504 E
(45) Date of Reissued Patent: Jul. 9, 2019

(54) LIGHT EMITTING DEVICE PACKAGE, LIGHT EMITTING DEVICE USING THAT PACKAGE, AND ILLUMINATION DEVICE USING THE LIGHT EMITTING DEVICES

(71) Applicant: NICHIA CORPORATION, Anan-shi (JP)

(72) Inventors: Takuya Nakabayashi, Tokushima (JP); Toshiyuki Hashimoto, Komatsushima (JP)

(73) Assignee: NICHIA CORPORATION, Anan-shi (JP)

(21) Appl. No.: 15/458,000

(22) Filed: Mar. 13, 2017

Related U.S. Patent Documents

Reissue of:
(64) Patent No.: 9,257,417
Issued: Feb. 9, 2016
Appl. No.: 14/141,429
Filed: Dec. 27, 2013

(30) Foreign Application Priority Data

Dec. 29, 2012 (JP) ..... 2012-289198

(51) Int. Cl.
*H01L 23/48* (2006.01)
*H01L 29/40* (2006.01)
(Continued)

(52) U.S. Cl.
CPC ..... *H01L 28/10* (2013.01); *H01L 23/5283* (2013.01)

(58) Field of Classification Search
CPC ..... H01L 27/15; H01L 21/48; H01L 21/50; H01L 21/4814; H01L 23/48; H01L 23/00;
(Continued)

(56) References Cited

U.S. PATENT DOCUMENTS 5,874,748 A 2/1999 Osawa
7,282,785 B2 10/2007 Yoshida
(Continued)

FOREIGN PATENT DOCUMENTS

EP 2383808 A2 11/2011
JP 63-213301 9/1988
(Continued)

OTHER PUBLICATIONS

English Machine Translation of JP-2009016095-A.*
(Continued)

*Primary Examiner* — Terrence R Till
(74) *Attorney, Agent, or Firm* — Mori & Ward, LLP

(57) ABSTRACT

The light emitting device package of the present invention has a longitudinal direction (as viewed from above) and a transverse direction perpendicular to the longitudinal direction, and is provided with a first and second lead-frame lined-up in the longitudinal direction and molded resin holds the first and second lead-frames integrally. The package is characterized in that the first lead-frame has a main body and an extension that extends from the main body with a narrowed width towards the second lead-frame. Further, a recess is established in the bottom surface of the first lead-frame, and at least part of the exposed region of the bottom surface of the extension is separated from the exposed region of the bottom surface of the main body by the molded resin that fills the recess.

34 Claims, 4 Drawing Sheets

(51) Int. Cl.
*H01L 23/52* (2006.01)
*H01L 49/02* (2006.01)
*H01L 23/528* (2006.01)

(58) Field of Classification Search
CPC ..... H01L 23/498; H01L 25/00; H01L 27/53; H01L 27/156; H01L 33/48; H01L 31/173; H01L 33/08; H01L 33/36; H01L 25/075; H01L 31/12; H01L 33/00; H01L 25/13; H01L 31/152; H01L 33/62; H01L 23/495; H01L 2224/45144; H01L 2224/48257; H01L 2224/48247; H01L 2224/48091; H01L 25/0753; H01L 25/167; H01L 33/486; H01L 33/647; F21Y 2105/10; F21Y 2103/10; F21Y 2115/10; F21Y 2105/12
See application file for complete search history.

(56) References Cited

U.S. PATENT DOCUMENTS

| | | | | |
|---|---|---|---|---|
| 7,675,145 | B2 | 3/2010 | Wong et al. | |
| 7,960,819 | B2 | 6/2011 | Loh et al. | |
| 8,030,839 | B2 | 10/2011 | Hosokawa et al. | |
| 8,202,746 | B2 | 6/2012 | Lee et al. | |
| 9,263,315 | B2 | 2/2016 | Oda et al. | |
| 2003/0075724 | A1 | 4/2003 | Wang et al. | |
| 2004/0056265 | A1 | 3/2004 | Arndt et al. | |
| 2005/0218489 | A1 | 10/2005 | Satou et al. | |
| 2005/0280017 | A1 | 12/2005 | Oshio et al. | |
| 2006/0170083 | A1 | 8/2006 | Kim et al. | |
| 2008/0042151 | A1* | 2/2008 | Oh et al. | 257/88 |
| 2008/0151557 | A1 | 6/2008 | Su et al. | |
| 2008/0210964 | A1 | 9/2008 | Tomioka | |
| 2010/0270571 | A1 | 10/2010 | Seo | |
| 2010/0314654 | A1 | 12/2010 | Hayashi | |
| 2011/0186875 | A1* | 8/2011 | Egoshi et al. | 257/89 |
| 2011/0215349 | A1 | 9/2011 | An et al. | |
| 2011/0220927 | A1 | 9/2011 | Min | |
| 2012/0025260 | A1 | 2/2012 | Oonakahara et al. | |
| 2012/0112227 | A1 | 5/2012 | Toyama | |
| 2012/0112622 | A1 | 5/2012 | Suzuki et al. | |
| 2012/0127720 | A1* | 5/2012 | Hussell | H01L 25/0753 362/249.02 |
| 2012/0319152 | A1 | 12/2012 | Park et al. | |
| 2013/0043504 | A1* | 2/2013 | Kobayakawa | H01L 33/62 257/99 |
| 2013/0087817 | A1 | 4/2013 | An et al. | |
| 2013/0127034 | A1 | 5/2013 | Hasegawa et al. | |
| 2013/0264604 | A1 | 10/2013 | Hayashi | |
| 2013/0270588 | A1* | 10/2013 | Wang | H01L 33/62 257/91 |
| 2013/0299854 | A1 | 11/2013 | Lee et al. | |
| 2014/0054629 | A1 | 2/2014 | Kim | |
| 2014/0117403 | A1 | 5/2014 | Hayashi | |
| 2014/0183574 | A1 | 7/2014 | Nakabayashi et al. | |
| 2014/0239321 | A1 | 8/2014 | Lu et al. | |
| 2014/0239332 | A1 | 8/2014 | Iwakura et al. | |
| 2014/0252574 | A1 | 9/2014 | Nakabayashi et al. | |
| 2014/0264426 | A1 | 9/2014 | Yamashita et al. | |
| 2015/0001559 | A1 | 1/2015 | Sasaoka et al. | |
| 2015/0021640 | A1 | 1/2015 | Oka et al. | |
| 2015/0162509 | A1 | 6/2015 | Kuramoto et al. | |

FOREIGN PATENT DOCUMENTS

| | | | |
|---|---|---|---|
| JP | 09-321344 | | 12/1997 |
| JP | 2003-023221 | | 1/2003 |
| JP | 2003-110145 | | 4/2003 |
| JP | 2005-353914 | | 12/2005 |
| JP | 3130684 | U | 4/2007 |
| JP | 2008-078500 | | 4/2008 |
| JP | 3140772 | U | 4/2008 |
| JP | 2009016095 | A * | 1/2009 |
| JP | 2011-505689 | | 2/2011 |
| JP | 2011-134902 | | 7/2011 |
| JP | 2011-151069 | | 8/2011 |
| JP | 2011-159837 | | 8/2011 |
| JP | 2011-176264 | | 9/2011 |
| JP | 2011-233821 | | 11/2011 |
| JP | 2011-249807 | | 12/2011 |
| JP | 2011-254080 | | 12/2011 |
| JP | 2012-084810 | | 4/2012 |
| JP | 2012-151436 | | 8/2012 |
| JP | 2012-182215 | | 9/2012 |
| JP | 2012-182485 | | 9/2012 |
| JP | 2012-190970 | | 10/2012 |
| JP | 2012-195430 | | 10/2012 |
| JP | 2012-209377 | | 10/2012 |
| JP | 2012-1954430 | | 10/2012 |
| KR | 10-2012-0001189 | | 1/2012 |
| KR | 10-1116951 | B1 | 3/2012 |
| TW | 201130172 | | 9/2011 |
| WO | WO 02/17401 | | 2/2002 |
| WO | WO 2008/081794 | | 7/2008 |
| WO | WO 2008/156020 | | 12/2008 |
| WO | WO 2012/014382 | | 2/2012 |

OTHER PUBLICATIONS

Englsih Abstract for JP-2009016095-A.*
Office Action issued by the United States Patent and Trademark Office for the co-pending U.S. Appl. No. 15/477,119, dated Feb. 5, 2018.
Office Action with Form PTO-892 Notice of References Cited issued by the United States Patent and Trademark Office for the co-pending U.S. Appl. No. 15/477,119, dated Aug. 29, 2017.
Extended European Search Report for corresponding EP Application No. 13199676.1-1551, dated Mar. 13, 2014.
Office Action with Form PTO-892 Notice of References Cited issued by the U.S. Patent and Trademark Office for the U.S. Appl. No. 14/064,200, dated Feb. 2, 2015.
Office Action issued by the U.S. Patent and Trademark Office for the U.S. Appl. No. 14/064,200, dated Jun. 29, 2015.
Extended European Search Report for corresponding EP Application No. 14174566.1-1551, dated Nov. 6, 2014.
Requirement for Restriction/Election issued by the U.S. Patent and Trademark Office for the U.S. Appl. No. 14/315,332, dated May 7, 2015.
Notice of Allowance issued by the U.S. Patent and Trademark Office for the U.S. Appl. No. 14/315,332, dated Aug. 17, 2015.
Notice of Allowance issued by the U.S. Patent and Trademark Office for the U.S. Appl. No. 14/064,200, dated Oct. 8, 2015.
Notice of Allowance issued by the U.S. Patent and Trademark Office for the U.S. Appl. No. 14/315,332, dated Dec. 9, 2015.
Office Action with Form PTO-892 Notice of References Cited issued by the U.S. Patent and Trademark Office for the U.S. Appl. No. 14/141,429, dated Feb. 23, 2015.
Notice of Allowance issued by the U.S. Patent and Trademark Office for the U.S. Appl. No. 14/141,429, dated Jun. 3, 2015.
Notice of Allowance issued by the U.S. Patent and Trademark Office for the U.S. Appl. No. 14/141,429, dated Sep. 15, 2015.
Notice of Allowance with Form PTO-892 Notice of References Cite issued by the U.S. Patent and Trademark Office for the U.S. Appl. No. 14/064,200, dated Nov. 20, 2015.
Notice of Allowance issued by the U.S. Patent and Trademark Office for the U.S. Appl. No. 14/315,332, dated Mar. 29, 2016.
Notice of Allowance issued by the U.S. Patent and Trademark Office for the U.S. Appl. No. 15/194,530, dated Jan. 3, 2017.
Notice of Allowance issued by the United States Patent and Trademark Office for the co-pending U.S. Appl. No. 15/968,806, dated Feb. 1, 2019.
Office Action issued by the United States Patent and Trademark Office for the co-pending U.S. Appl. No. 15/968,806, dated Aug. 27, 2018.

* cited by examiner

LIGHT EMITTING DEVICE PACKAGE, LIGHT EMITTING DEVICE USING THAT PACKAGE, AND ILLUMINATION DEVICE USING THE LIGHT EMITTING DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

1. Field of the Invention

The present invention relates to a light emitting device package (also referred to simply as the package), to a light emitting device, and to an illumination device.

2. Description of the Related Art

As an example, FIG. 25 of Japanese Laid-Open Patent Publication 2011-249807 shows a light emitting device.

Specifically, JP 2011-249807 A cites a light emitting device that includes a body having a cavity, a first and second lead-plate disposed in an electrically isolated manner at the bottom of the cavity, and a first and second light emitting diode disposed at the bottom of the cavity on the first and second lead-plate respectively. Further, one end of the first lead-plate extends towards the second lead-plate, and one end of the second lead-plate extends towards the first lead-plate.

However, if exposed regions of the bottom surfaces of the first and second lead-plates are distorted in shape, surface mounting characteristics (package mounting) with conducting paste degrade.

The present invention was developed considering the state-of-the-art with the object of providing a light emitting device package well suited for holding a plurality of light emitting elements and with superior surface mounting with conducting paste.

SUMMARY OF THE INVENTION

To resolve the issues described above, the light emitting device package of the present invention has a longitudinal direction as viewed from above and a transverse direction perpendicular to the longitudinal direction, and is provided with a first and second lead-frame lined-up in the longitudinal direction and molded resin holds with the first and second lead-frames integrally. The package is characterized in that the first lead-frame has a main body and an extension that narrows as it extends from the main body towards the second lead-frame. Further, a recess is established in the bottom surface of the first lead-frame, and at least part of the exposed region of the bottom surface of the extension is separated from the exposed region of the bottom surface of the main body by the molded resin that fills the recess.

The present invention can realize a light emitting device package which allows bonding wires connected to the lead-frames to be made relatively short in length and which shows superior surface mounting characteristics with conducting mounting adhesive. The above and further objects of the present invention as well as the features thereof will become more apparent from the following detailed description to be made in conjunction with the accompanying drawings.

DETAILED DESCRIPTION OF THE EMBODIMENT(S)

The following describes implementation modes and embodiments of the present invention with reference to appropriate figures. However, the light emitting device package, light emitting device, and illumination device described below are merely specific examples of the technology associated with the present invention, and unless otherwise noted, the present invention is not limited to the modes of implementation and embodiments described below. The details of one implementation mode or embodiment may also be applicable to other implementation modes or embodiments. Further, properties such as size and positional relation of materials and components shown in the various figures may be exaggerated for purposes of descriptive clarity.

<First Mode of Implementation>

Figure 1A:
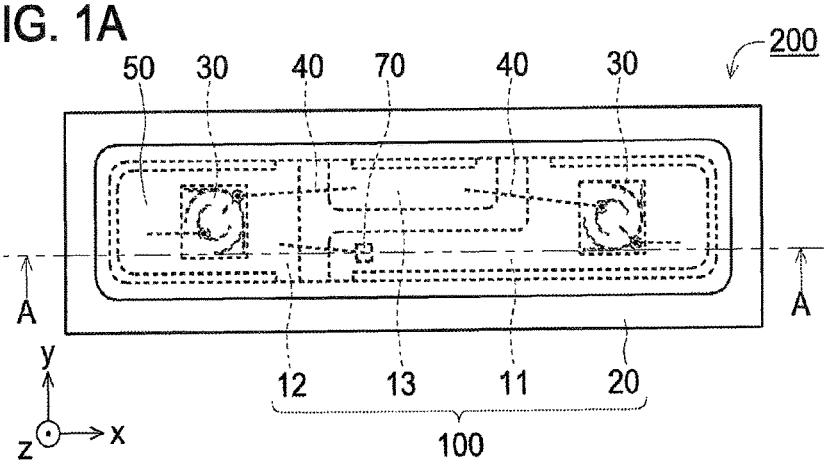
FIG. 1A is an abbreviated top view of a light emitting device for an implementation of the present invention.
Figure 1B:
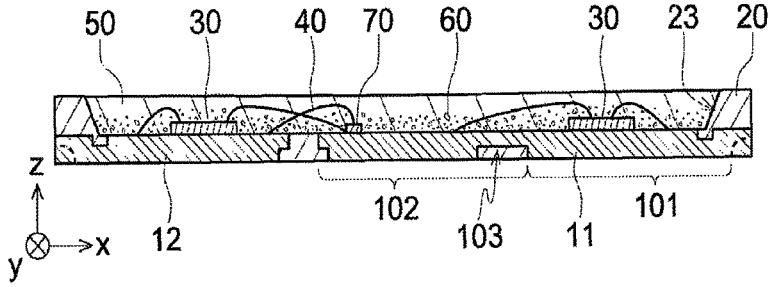
FIG. 1B is an abbreviated cross-section view through line A-A in FIG. 1A.
Figure 1C:
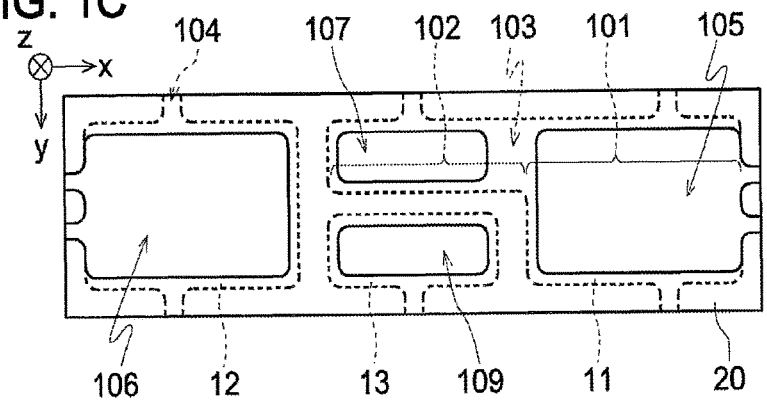
FIG. 1C is an abbreviated bottom view of the light emitting device in FIG. 1A.

FIGS. 1A and 1C are abbreviated top and bottom views of a light emitting device for the first mode of implementation, and FIG. 1B is an abbreviated cross-section view through line A-A in FIG. 1A. As shown in FIGS. 1A-C, the light emitting device 200 for the first mode of implementation is primarily configured with light emitting elements 30 mounted in a light emitting device package 100 and enclosed by encapsulating material 50. Although the encapsulating material 50 of the present example includes fluorescent material 60, the fluorescent material 60 can be omitted.

As shown in FIGS. 1A-C, the package 100 as viewed from above has a shape with a long dimension in one direction. Namely, when viewed from above, the package 100 has a longitudinal direction and a (shorter) transverse, transverse direction perpendicular to the longitudinal direction. More specifically, the longitudinal direction is the direction parallel to the lead-frame package sides that extend in the long direction (which are the outer surfaces of the package normal to the transverse direction) as viewed from above. In FIGS. 1A-C, the longitudinal direction of the package is the x-direction, the transverse direction is the y-direction and the up and down (vertical) direction is the z-direction. Accordingly, the x-direction is the length direction, the y-direction is the width direction, and the z-direction is the thickness direction. These directionality designations are also applicable to light emitting device packages and light emitting devices for other modes of implementations described subsequently.

The package 100 shown in FIGS. 1A-C is provided with two lead-frames 11, 12, and molded resin 20 holds the two lead-frames integrally. A third lead-frame 13 is provided between the two lead-frames 11, 12, and molded resin 20 holds the three lead-frames 11, 12, 13 integrally. The two lead-frames 11, 12 are lined-up in the longitudinal direction of the package 100. Each of the lead-frames 11, 12, 13 is shaped with a long dimension in the longitudinal direction (x-direction) similar to the shape of the package 100. The lead-frames 11, 12, 13 have a plate (sheet-metal) form with practically no processing such as bending or folding implemented. The two lead-frames 11, 12 (more specifically, the three lead-frames 11, 12, 13) have a gap region that separates the lead-frames. The gap region is filled with the molded resin 20, and the molded resin 20 holds the lead frames integrally with the gap region as an electrical isolation region. At least parts of the bottom surfaces of the three lead-frames 11, 12, 13 are exposed from the molded resin 20 and together with the molded resin 20 form the bottom surface of the package 100. This achieves a package with superior surface mounting characteristics with conducting mounting adhesive and superior thermal dissipation characteristics. Note that the light emitting elements are mounted on the upper surface of the package 100. For the package 100 in this implementation, the lead-frame on the right side is called the first lead-frame 11, the lead-frame on the left side is called the second lead-frame 12, and the lead-frame between those two lead-frames 11, 12 is called the third lead-frame 13.

The molded resin 20 has a rectangular shape (as viewed from above) that extends in the longitudinal direction (x-direction) of the package. The molded resin 20 covers the edges (except for pre-molding support structure 104 edges) of the lead-frames (i.e. the three lead-frames 11, 12, 13). The molded resin 20 covers part (in particular, periphery regions) of the upper surfaces of the lead-frames (i.e. the three lead-frames 11, 12, 13). Further, the molded resin 20 together with the lead-frames (i.e. the three lead-frames 11, 12, 13) forms a cavity to hold the light emitting elements. Specifically, the bottom of the cavity is formed by the upper surfaces of the lead-frames 11, 12, 13 and the surface of the molded resin 20. Side-wall surfaces of the cavity (interior surfaces of the side-walls 23) are formed by surfaces of the molded resin 20. Although the cavity side-wall surfaces can be vertical, tapered side-wall surfaces that reduce the size of the cavity opening towards the bottom of the cavity are preferable for efficiently extracting light emitted by the light emitting elements. Here, an example of a package with a cavity is presented, but it is also possible, for example, to make a flat package with no cavity and no side-walls 23 (and that type of package can be applied in other modes of implementation).

The first lead-frame 11 has a main body 101 and an extension 102 that extends towards the second lead-frame 12 from the main body 101 with a narrowed width. In the present example, a recess 103 is established in the bottom surface of the extension 102 of the first lead-frame 11. The recess 103 is filled with molded resin 20. The recess 103 filled with the molded resin 20 separates at least part of the exposed region 107 of the bottom surface of the extension 102 from the exposed region 105 of the bottom surface of the main body 101.

The main body 101 can be considered as the primary part of the lead-frame including the region of the upper surface where a light emitting element is mounted. Although it is desirable for the extension 102 to extend from the main body 101 with approximately constant width (in the transverse y-direction) to obtain an exposed region with a preferable shape, the extension can also vary in width as it extends from the main body 101. The boundary between the main body 101 and the extension 102 can be considered to be, for example, a straight-line in the transverse y-direction passing through the point where width of the lead-frame 11 changes. The depth of the recess 103 is determined in view of molded resin infilling and lead-frame strength and is, for example, preferably greater than or equal to 1 mm and less than or equal to approximately half the maximum thickness of the lead-frame.

In a package 100 configured as described above, the exposed region 105 of the bottom surface of the main body of the lead-frame 11 is separated from at least part of the exposed region 107 of the bottom surface of the extension, and the separated exposed regions are formed in the shape of islands surrounded by the molded resin 20. This can improve symmetry of the exposed regions of the bottom surfaces of the lead-frames and can improve the surface area uniformity of those exposed regions. Accordingly, when the package 100 is surface mounted with conducting mounting adhesive, uneven conducting mounting adhesive application can be controlled and inclined package 100 mounting can be curtailed. Further, the self-aligning capability of the package 100 can be enhanced.

In addition, since the extension 102 of the first lead-frame 11 extends towards the second lead-frame 12, bonding wires 40 from the light emitting elements 30 and protection device 70 or the protection device 70 itself can be attached to the upper surface of the extension 102. This allows the bonding wires 40 to be made relatively short, and can alleviate light reduction due to the bonding wires 40 to increase light extraction efficiency.

Although the maximum width (the maximum dimension in the transverse y-direction, for example, the width of the main body of the lead-frame) of the two lead-frames 11, 12 can be different, it is preferable for the maximum widths to be approximately the same. Although the two lead-frames 11, 12 can be oriented at a skewed angle with respect to each other (as viewed from above), it is preferable for the lead-frames to be disposed approximately parallel to each other. Further, although die lead-frames 11, 12 can be disposed with their longitudinal (x-direction) centerlines shifted in the transverse y-direction (as viewed from above), it is preferable for the lead-frames to be disposed with their longitudinal (x-direction) centerlines approximately aligned (in a single straight-line).

The following describes a preferable implementation of the light emitting device package 100 and light emitting device 200.

As shown in FIGS. 1A-C, it is preferable for essentially the entire exposed region 107 of the bottom surface of the extension 102 to be separated from the exposed region 105 of the bottom surface of the main body 101 by molded resin 20 filling the recess 103. This configuration can be realized by establishing the recess 103 on the bottom surface of the extension 102 next to the main body 101 (as shown in the figures), on the bottom surface of the main body 101 next to the extension 102, or along the boundary between the main body 101 and the extension 102. By establishing the recess 103 in the vicinity of the boundary between the main body 101 and the extension 102, the exposed region 105 of the bottom surface of the main body 101 and the exposed region 107 of the bottom surface of the extension 102 can be clearly separated. This produces an advantageous layout of the exposed regions 105, 107 of the main body 101 and extension 102 to further improve the symmetry and surface area uniformity of exposed regions of the bottom surfaces of the lead-frames, and further enhance the self-aligning capability of the package.

As shown in FIGS. 1A-C, only the first lead-frame 11 of the package 100 has an extension 102. The package 100 has the third lead-frame 13 established opposite (in the transverse y-direction) the extension 102 of the first lead-frame 11. At least part of the bottom surface of the third lead-frame 13 is exposed from the molded resin 20. Since this configuration establishes an exposed region 109 of the bottom surface of the third lead-frame opposite the exposed region 107 of the bottom surface of the extension of the first lead-frame, it can improve the symmetry and surface area uniformity of exposed regions of the bottom surfaces of the lead-frames.

As shown in FIGS. 1A-C, the exposed region 107 of the bottom surface of the extension of the first lead-frame is established in an approximately rectangular shape. This makes it easy to improve the symmetry and surface area uniformity of exposed regions of the bottom surfaces of the lead-frames, and makes it easy to enhance the self-aligning capability of the package. In addition, the exposed region 109 of the bottom surface of the third lead-frame 13 is also established in an approximately rectangular shape. This enables the exposed region 109 to balance with the exposed region 107 of the bottom surface of the extension of the first lead-frame to improve the symmetry and surface area uniformity of exposed regions of the bottom surfaces of the lead-frames and improve package self-alignment. It is even more desirable to form the exposed region 109 of the bottom surface of the third lead-frame 13 in approximately the same (rectangular) shape as the exposed region 107 of the bottom surface of the extension of the first lead-frame (as shown in the figures). Further, the exposed region 105 of the bottom surface of the main body of the first lead-frame and the exposed region 106 of the bottom surface of the second lead-frame 12 (which can be viewed as the main body of the second lead-frame) are also established in approximately rectangular shapes. This can further improve the symmetry and surface area uniformity of exposed regions of the bottom surfaces of the lead-frames and further improve package self-alignment. When the overall pattern of lead-frame exposed regions on the bottom surface of the package 100 is examined, it is clear that transverse (y-direction) linear symmetry is obtained about the longitudinal (x-direction) centerline of the package. It is also clear that longitudinal (x-direction) symmetry is obtained about a line in the y-direction through the center of the package. This can still further improve the symmetry and surface area uniformity of exposed regions of the bottom surfaces of the lead-frames and further improve package self-alignment. Here, the exposed regions of the bottom surfaces of the lead-frames can have rounded or truncated corners due to lead-frame processing such as beveling.

As shown in FIGS. 1A-C, the extension 102 of the first lead-frame is positioned approximately in the center of the package 100 in the longitudinal (x-direction). Positioning the extension 102 approximately at the longitudinal center of the package 100 makes it easy to mount light emitting elements on each of the two lead-frames 11, 12 and makes it easy to control luminance distribution characteristics. Further, the third lead-frame 13 is disposed opposite the extension 102 in the transverse y-direction of the package 100. Consequently, even when light emitting elements 30 are mounted on the first and second lead-frames 11, 12 respectively, bonding wires 40 connected to the third lead-frame 13 can be made relatively short. This configuration makes it easy to alleviate light reduction due to the bonding wires 40 and increase light extraction efficiency. In the case of a light emitting device provided with a protection device 70, the protection device 70 can be mounted on the upper surface of the first lead-frame extension 102. This makes it easy to increase the separation between the light emitting elements 30 and the protection device 70. Thus, light reduction due to the protection device 70 is easy to alleviated, so that the light extraction efficiency can be increased easily. Further, since the bonding wire 40 connecting the protection device 70 to the second lead-frame 12 can be made relatively short, light reduction due to the bonding wire 40 can be alleviated and light extraction efficiency can be easily improved.

As shown in FIGS. 1A-C, the light emitting device 200 is provided with a light emitting device package 100 and light emitting elements 30 mounted on the upper surfaces of the first and second lead-frames 11, 12 respectively. By mounting light emitting elements 30 on each of the two lead-frames 11, 12, the separation between the two light emitting elements 30 can be made relatively large and favorable luminance distribution characteristics can be obtained.

As shown in the light emitting device 200 of FIGS. 1A-C, the upper surface of the third lead-frame 13 is connected by a bonding wire 40 to the light emitting element 30 mounted on the first lead-frame 11, and is connected by another bonding wire 40 to the light emitting element 30 mounted on the second lead-frame 12. This advantageously utilizes the third lead-frame 13 to connect light emitting elements 30 mounted on the first and second lead-frames 11, 12 in series and allows the length of the bonding wires 40 to be made relatively short.

As shown in FIGS. 1A-C, the light emitting device 200 is provided with a protection device 70 mounted on the upper surface of the first lead-frame extension 102. The protection device 70 is connected to the upper surface of the second lead-frame 12 by a bonding wire 40. This advantageously utilizes the first lead-frame extension 102 to carry the protection device 70. Mounting the protection device 70 on the upper surface of the first lead-frame extension 102 makes it easy to increase separation between the protection device 70 and the light emitting elements 30. Thus, it becomes easy to alleviate light reduction due to the protection device 70, and thus to increase light extraction efficiency. Also as mentioned previously, since the bonding wire 40 connecting the protection device 70 to the second lead-frame 12 can be made relatively short, light reduction due to the bonding wire 40 can be alleviated and light extraction efficiency can be easily improved.

<Second Mode of Implementation>

Figure 2A:
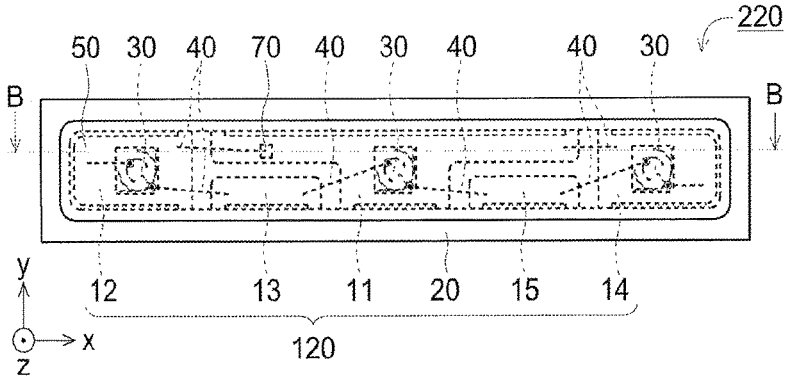
FIG. 2A is an abbreviated top view of a light emitting device for another implementation of the present invention.
Figure 2B:
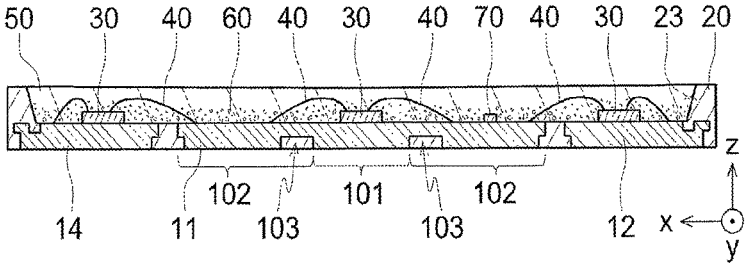
FIG. 2B is an abbreviated cross-section view through line B-B in FIG. 2A.
Figure 2C:
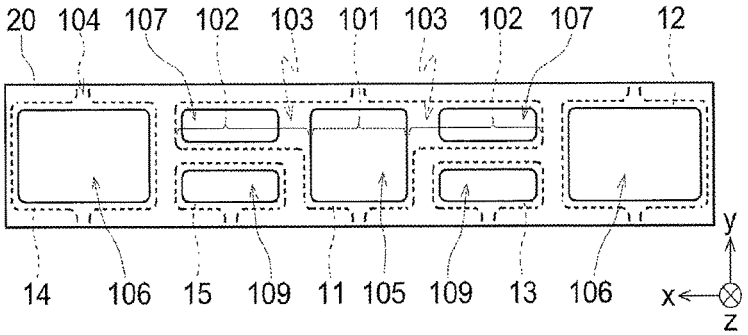
FIG. 2C is an abbreviated bottom view of the light emitting device in FIG. 2A.

FIGS. 2A and 2C are abbreviated top and bottom views of a light emitting device for the second mode of implementation, and FIG. 2B is an abbreviated cross-section view through line B-B in FIG. 2A. As shown in FIGS. 2A-C, the light emitting device 220 for the second mode of implementation is primarily configured with light emitting elements 30 mounted in a light emitting device package 120 and enclosed by encapsulating material 50. Although the encapsulating material 50 of the present example includes fluorescent material 60, the fluorescent material 60 can be omitted.

The package 120 shown in FIGS. 2A-C is provided with five lead-frames 11, 12, 13, 14, 15 and molded resin 20 holds the five lead-frames integrally. The five lead-frames 11, 12, 13, 14, 15 are lined-up in the longitudinal direction (x-direction) of the package 120. Each of the lead-frames 11, 12, 13, 14, 15 is shaped with a long dimension in the longitudinal direction (x-direction) similar to the shape of the package 120. The lead-frames 11, 12, 13, 14, 15 have a plate (sheet-metal) form with practically no processing such as bending or folding implemented. The five lead-frames 11, 12, 13, 14, 15 have gap regions that separate the lead-frames and are filled with the molded resin 20. The molded resin 20 holds lead flames integrally with the gap regions as electrical isolation regions. At least parts of the bottom surfaces of the five lead-frames 11, 12, 13, 14, 15 are exposed from the molded resin 20 and together with the molded resin 20 form the bottom surface of the package 120. This achieves a package with superior surface mounting characteristics with conducting mounting adhesive and superior thermal dissipation characteristics. Note that the light emitting elements are mounted on the upper surface of the package 120. For the package 120 in this implementation, the lead-frame in the center is called the first lead-frame 11, the lead-frame furthest to the left is called the second lead-frame 12, the lead-frame between the first lead-frame 11 and the second lead-frame 12 is called the third lead-frame 13, the lead-frame furthest to the right is called the fourth lead-frame 14, and the lead-frame between the first lead-frame 11 and the fourth lead-frame 14 is called the fifth lead-frame 15.

The molded resin 20 has a rectangular shape (as viewed from above) that extends in the longitudinal direction (x-direction) of the package. The molded resin 20 covers the edges (except for pre-molding support structure 104 edges) of the lead-frames 11, 12, 13, 14, 15. The molded resin 20 covers part (in particular, periphery regions) of the upper surfaces of the lead-frames 11, 12, 13, 14, 15. Further, the molded resin 20 together with the lead-frames 11, 12, 13, 14, 15 forms a cavity to hold the light emitting elements. Specifically, the bottom of the cavity is formed by the upper surfaces of the lead-frames 11, 12, 13, 14, 15 and the surface of the molded resin 20. Side-wall surfaces of the cavity (interior surfaces of the side-walls 23) are formed by surfaces of the molded resin 20. Although the cavity side-wall surfaces can be vertical, tapered side-wall surfaces that reduce the size of the cavity opening towards the bottom of the cavity are preferable for efficiently extracting light emitted by the light emitting elements.

The first lead-frame 11 has a main body 101, a first extension 102 that extends towards the second lead-frame 12 from the main body 101 with a narrowed width, and a second extension 102 that extends towards the fourth lead-frame 14 from the main body 101 with a narrowed width. In the present example, recesses 103 are established in the bottom surfaces of the first and second extensions 102 of the first lead-frame 11. The recesses 103 are filled with molded resin 20. The recesses 103 filled with molded resin 20 separate at least parts of the exposed regions 107 of the bottom surfaces of the first and second extensions 102 from the exposed region 105 of the bottom surface of the main body 101.

In a package 120 configured as described above, the exposed region 105 of the bottom surface of the main body of the first lead-frame 11 is separated from at least parts of the exposed regions 107 of the bottom surfaces of the first and second extensions 102, and exposed region 105 and the exposed region 107 are formed in the shape of islands (surrounded by the molded resin 20). This can improve symmetry of the exposed regions of the bottom surfaces of the lead-frames and thus can improve the surface area uniformity of those exposed regions. Accordingly, when the package 120 is surface mounted with conducting mounting adhesive, uneven conducting mounting adhesive application can be controlled and inclined package 120 mounting can be curtailed. Further, the self-aligning capability of the package 120 can be enhanced.

In addition, since the first and second extensions 102 of the first lead-frame 11 extend towards the second and fourth lead-frames 12, 14 respectively, bonding wires 40 from the light emitting elements 30 and protection device 70 or the protection device 70 itself can be attached to the upper surfaces of the extensions 102. This allows the bonding wires 40 to be made relatively short, and can alleviate light reduction due to the bonding wires 40 to increase light extraction efficiency.

Although the maximum width (the maximum dimension in the transverse y-direction, for example, the width of the main body of a lead-frame) of the first, second, and fourth lead-frames 11, 12, 14 can be different, it is preferable for the maximum widths to be approximately the same. Although the first, second, and fourth lead-frames 11, 12, 14 can be oriented at skewed angles with respect to each other (as viewed from above), it is preferable for the lead-frames to be disposed approximately parallel to each other. Further, although the first, second, and fourth lead-frames 11, 12, 14 can be disposed with their longitudinal (x-direction) centerlines shifted in the transverse y-direction (as viewed from above), it is preferable for the lead-frames to be disposed with their longitudinal (x-direction) centerlines approximately aligned (in a single straight-line).

The following describes a preferable implementation of the light emitting device package 120 and light emitting device 220.

As shown in FIG. 2, only the first lead-frame 11 of the package 120 has extensions 102. The package 120 has the third and fifth lead-frames disposed opposite (in the transverse y-direction) the first and second extensions 102 respectively of the first lead-frame 11. Since this configuration establishes exposed regions 109 of the bottom surfaces of the third and fifth lead-frames opposite exposed regions 107 of the bottom surfaces of the first and second extensions (respectively) of the first lead-frame, it can improve the symmetry and surface area uniformity of exposed regions of the bottom surfaces of the lead-frames.

As shown in FIG. 2, the exposed regions 107 of the bottom surfaces of the first and second extensions of the first lead-frame are established in approximately rectangular shapes. In addition, the exposed regions 109 of the bottom surfaces of the third and fifth lead-frames 13, 15 are also established in approximately rectangular shapes. Further, the exposed region 105 of the bottom surface of the main body of the first lead-frame and the exposed regions 106 of the bottom surfaces of the second and fourth lead-frames 12, 14 which can be viewed as main bodies are also established in approximately rectangular shapes. When the overall pattern of lead-frame exposed regions on the bottom surface of the package 120 is examined, it is clear that approximate linear symmetry is obtained both transversally (in the y-direction) about the longitudinal (x-direction) centerline of the package and longitudinally (in the x-direction) about a line in the y-direction through the center of the package. In the same manner as the first mode of implementation, this type of structure makes it easy to improve the symmetry and surface area uniformity of exposed regions of the bottom surfaces of the lead-frames, and makes it easy to enhance the self-aligning capability of the package 120. Here, the exposed regions of the bottom surfaces of the lead-frames can have rounded or truncated corners due to lead-frame processing such as beveling.

As shown in the light emitting device 220 of FIG. 2, the upper surface of the third lead-frame 13 is connected by a bonding wire 40 to the light emitting element 30 mounted on the first lead-frame 11, and is connected by another bonding wire 40 to the light emitting element 30 mounted on the second lead-frame 12. The upper surface of the fifth lead-frame 15 is connected by a bonding wire 40 to the light emitting element 30 mounted on the first lead-frame 11, and is connected by another bonding wire 40 to the light emitting element 30 mounted on the fourth lead-frame 14. This connects the three light emitting elements 30 in series. Namely, the third and fifth lead-frames 13, 15 are advantageously utilized to connect light emitting elements 30 mounted on the first, second, and fourth lead-frames 11, 12, 14 in series, and this allows the length of the bonding wires 40 to be made relatively short.

As shown in FIG. 2, the light emitting device 220 has a protection device 70 mounted on the upper surface of the first extension 102 of the first lead-frame and the protection device 70 is connected to the second lead-frame 12 by a bonding wire 40. This allows the bonding wire 40 connecting the protection device 70 and the lead-frame to be made relatively short, and can alleviate light reduction due to the bonding wire 40 making it easy to increase the light extraction efficiency. Further, the upper surface of the second extension 102 of the first lead-frame and the upper surface of the fourth lead-frame 14 are connected by a bonding wire 40. This allows the protection device 70 to be connected in parallel with respect to the light emitting elements 30. Note that since the package 120 has the second extension 102 of the first lead-frame connected to the fourth lead-frame 14, the first lead-frame 11 and the fourth lead-frame 14 can also be made as a single-piece.

Third Mode of Implementation>

Figure 3A:
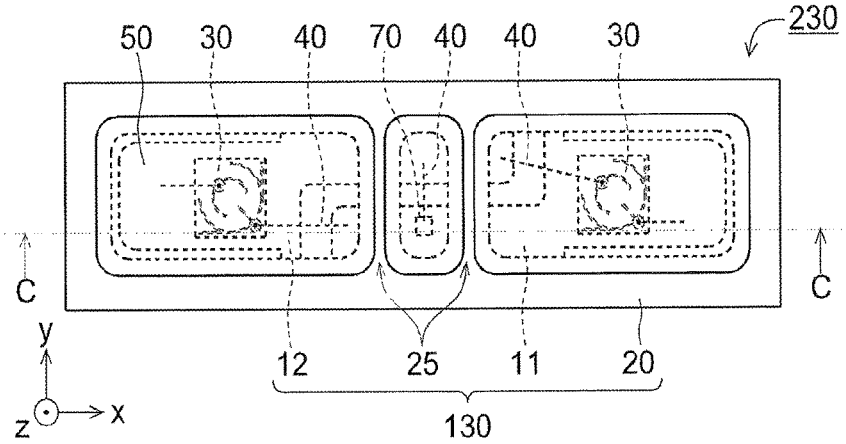
FIG. 3A is an abbreviated top view of a light emitting device for another implementation of the present invention.
Figure 3B:
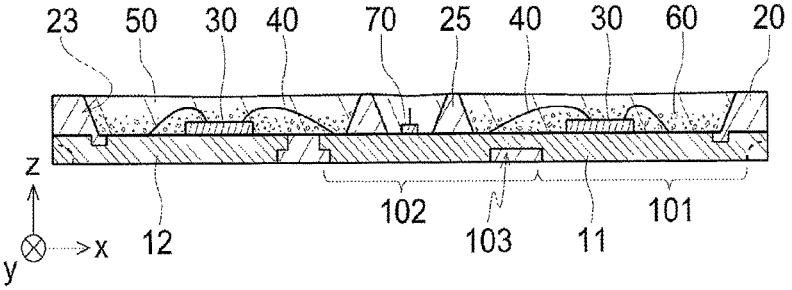
FIG. 3B is an abbreviated cross-section view through line C-C in FIG. 3A.
Figure 3C:
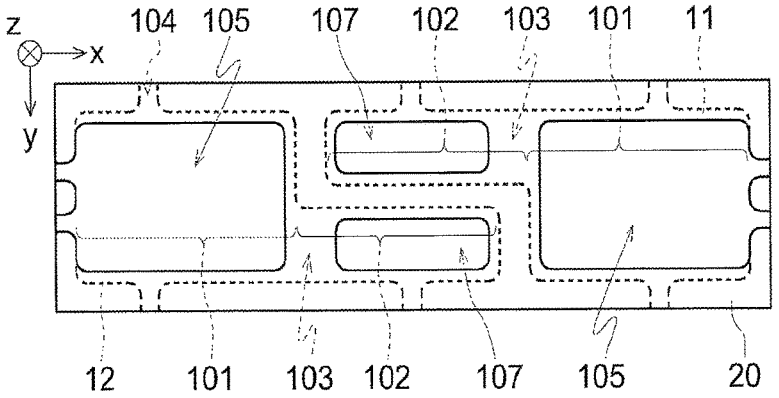
FIG. 3C is an abbreviated bottom view of the light emitting device in FIG. 3A.

FIGS. 3A and 3C are abbreviated top and bottom views of a light emitting device for the third mode of implementation, and FIG. 3B is an abbreviated cross-section view through line C-C in FIG. 3A. As shown in FIGS. 3A-C, the light emitting device 230 for the third mode of implementation is primarily configured with light emitting elements 30 mounted in a light emitting device package 130 and enclosed by encapsulating material 50. Although the encapsulating material 50 of the present example includes fluorescent material 60, the fluorescent material 60 can be omitted.

The package 130 shown in FIGS. 3A-C is provided with two lead-frames 11, 12, and molded resin 20 holds the two lead-frames integrally. The two lead-frames 11, 12 are lined-up in the longitudinal x-direction of the package 130. Each of the lead-frames 11, 12 is shaped with a long dimension in the longitudinal direction (x-direction) similar to the shape of the package 130. The lead-frames 11, 12 have a plate (sheet-metal) form with practically no processing such as bending or folding. The two lead-frames 11, 12 have a gap region that separates the lead-frames. The gap region is filled with the molded resin 20, and the molded resin 20 holds the lead frames integrally by molded resin 20 with the gap region as an electrical isolation region. At least parts of the bottom surfaces of the two lead-frames 11, 12 are exposed from the molded resin 20 and together with the molded resin 20 form the bottom surface of the package 130. This achieves a package with superior surface mounting characteristics with conducting mounting adhesive and superior thermal dissipation characteristics. Note that the light emitting elements are mounted on the upper surface of the package 130. For the package 130 in this implementation, the lead-frame on the right side is called the first lead-frame 11, and the lead-frame on the left side is called the second lead-frame 12.

The molded resin 20 has a rectangular shape (as viewed from above) that extends in the longitudinal direction (x-direction) of the package. The molded resin 20 covers the edges (except for pre-molding support structure 104 edges) of the two lead-frames 11, 12. The molded resin 20 covers part (in particular, periphery regions) of the upper surfaces of the two lead-frames 11, 12. Further, the molded resin 20 together with the two lead-frames 11, 12 forms cavities to hold the light emitting elements. Specifically, the bottoms of the cavities are formed by the upper surfaces of the lead-frames 11, 12 and surfaces of the molded resin 20. Side-wall surfaces of the cavities (interior surfaces of the side-walls 23) are formed by surfaces of the molded resin 20. Although cavity side-wall surfaces can be vertical, tapered side-wall surfaces that reduce the size of each cavity opening towards the bottom of the cavity are preferable for efficiently extracting light emitted by the light emitting elements.

The first lead-frame 11 has a main body 101 and an extension 102 that extends towards the second lead-frame 12 from the main body 101 with a narrowed width. A recess 103 is established in the bottom surface of the extension 102, and the recess 103 is filled with molded resin 20. The recess 103 filled with molded resin 20 separates at least part of the exposed region 107 of the bottom surface of the extension 102 from the exposed region 105 of the bottom surface of the main body 101.

In a package 130 configured as described above, the exposed region 105 of the bottom surface of the main body 101 of the first lead-frame 11 is separated from at least part of the exposed region 107 of the bottom surface of the extension 102, and the exposed region 105 and the exposed region 107 are formed in the shape of islands (surrounded by the molded resin 20). This can improve symmetry of the exposed regions of the bottom surfaces of the lead-frames and can improve the surface area uniformity of those exposed regions. Accordingly, when the package 130 is surface mounted with conducting mounting adhesive, uneven conducting mounting adhesive application can be controlled and inclined package 130 mounting can be curtailed. Further, the self-aligning capability of the package 130 can be enhanced.

In addition, since the extension 102 of the first lead-frame 11 extends towards the second lead-frame 12, bonding wires 40 from the light emitting elements 30 and protection device 70 or the protection device 70 itself can be attached to the upper surface of the extension 102. This allows the bonding wires 40 to be made relatively short, and thus can alleviate light reduction due to the bonding wires 40 to increase light extraction efficiency.

Although the maximum width (the maximum dimension in the transverse y-direction, for example, the width of the main body of the lead-frame) of the two lead-frames 11, 12 can be different, it is preferable for the maximum widths to be approximately the same. Although the two lead-frames 11, 12 can be oriented at a skewed angle with respect to each other (as viewed from above), it is preferable for the lead-frames to be disposed approximately parallel to each other. Further, although the two lead-frames 11, 12 can be disposed with their longitudinal (x-direction) centerlines shifted in the transverse y-direction (as viewed from above), it is preferable for the lead-frames to be disposed with their lengthwise (x-direction) centerlines approximately aligned (in a single straight-line).

The following describes a preferable implementation of the light emitting device package 130 and light emitting device 230.

As shown in the package 130 of FIG. 3, the second lead-frame 12 has a main body 101 and an extension 102 that extends towards the first lead-frame 11 from the main body 101 with a narrowed width. A recess 103 is established in the bottom surface of the second lead-frame 12, and the recess 103 is filled with molded resin 20. The recess 103 in the second lead-frame 12 filled with the molded resin 20 separates at least part of the exposed region 107 of the bottom surface of the extension 102 of the second lead-frame 12 from the exposed region 105 of the bottom surface of the main body 101 of the second lead-frame 12. The extensions 102 of the first and second lead-frames 11, 12 are disposed opposite each other in transverse y-direction.

With this type of structure, in addition to the first lead-frame 11, at least part of the exposed region 107 of the bottom surface of the extension 102 of the second lead-frame 12 is separated from the exposed region 105 of the bottom surface of the main body 101 of the second lead-frame 12 forming islands of exposed lead-frame in the molded resin 20. This makes it easy to improve the symmetry and surface area uniformity of exposed regions of the bottom surfaces of the lead-frames. Accordingly, when the package 130 is surface mounted with conducting mounting adhesive, uneven conducting mounting adhesive application can be controlled and inclined package 130 mounting can be curtailed. Further, the self-aligning capability of the package 130 can be enhanced. Since the exposed region 107 of the extension 102 of the first lead-frame 11 and the exposed region 107 of the extension 102 of the second lead-frame 12 are established opposite each other, the symmetry and surface area uniformity of exposed regions of the bottom surfaces of the lead-frames can be improved. Further improvement results when the exposed region 107 of the extension 102 of the first lead-frame 11 and the exposed region 107 of the extension 102 of the second lead-frame 12 are made in approximately the same shape.

As shown in the package 130 of FIG. 3, the exposed regions 107 of the bottom surfaces of the first and second lead-frames 11, 12 are established in approximately rectangular shapes. Further, the exposed regions 105 of the bottom surfaces of the main bodies of the first and second lead-frames 11, 12 are also established in approximately rectangular shapes. When the overall pattern of lead-frame exposed regions on the bottom surface of the package 130 is examined, it is clear that symmetry is obtained both transversally (in the y-direction) about the lengthwise (x-direction) centerline of the package and longitudinally (in the x-direction) about a line in the y-direction through the center of the package. In the same manner as the first mode of implementation, this type of structure makes it easy to improve the symmetry and surface area uniformity of exposed regions of the bottom surfaces of the lead-frames, and makes it easy to enhance the self-aligning capability of the package 130. Here, the exposed regions of the bottom surfaces of the lead-frames can have rounded or truncated corners due to lead-frame processing such as beveling.

In the light emitting device 230, the extension 102 of the first lead-frame 11 is connected by a bonding wire 40 to the light emitting element 30 mounted on the second lead-frame 12, and the extension 102 of the second lead-frame 12 is connected by a bonding wire 40 to the light emitting element 30 mounted on the first lead-frame 11. This advantageously utilizes the extensions 102 of the first and second lead-frames 11, 12 to connect the light emitting elements 30 mounted on the first and second lead-frames 11, 12 in parallel and thus allows the length of the bonding wires 40 to be made relatively short.

In the light emitting device 230, a protection device 70 is mounted on the upper surface of the first lead-frame extension 102. The protection device 70 is connected to the upper surface of the extension 102 of the second lead-frame 12 by a bonding wire 40. This advantageously utilizes the first and second lead-frame extensions 102 to accommodate the protection device 70. This makes it easy to increase separation between the protection device 70 and the light emitting elements 30, to alleviate light reduction due to the protection device 70, and to increase light extraction efficiency. Since the bonding wire 40 connecting the protection device 70 to the second lead-frame 12 can be made relatively short, light reduction due to the bonding wire 40 can be alleviated and light extraction efficiency can be easily improved.

As shown in FIG. 3, the molded resin 20 on the top of the package 130 has partition walls 25 extending in the transverse y-direction that partition and expose at least part of the upper surface of the main body 101 of the first lead-frame 11 and at least part of the upper surface of the extension 102 of the first lead-frame 11 at the second lead-frame 12 end. Accordingly, while maintaining the utility of the upper surfaces of the extensions 102, the main body 101 of the first lead-frame 11 can be partitioned from the main body 101 of the second lead-frame 12 by the partition walls 25. This allows the partition walls 25 to reflect light emitted by the light emitting elements 30 in an upward direction, and alleviate light reduction due to the light emitting elements 30, protection device 70 and their associated bonding wires 40 to those elements, which are disposed. Thus, the light extraction efficiency can be improved. The partition walls 25 are formed in a continuous manner with the molded resin 20 cavity side-walls 23. Accordingly, the partition walls 25 act in a manner pressing downward on the upper surfaces of the lead-frames and can serve to suppress lead-frame delamination from the molded resin 20. Note that partition walls 25 can be established at least on the first lead-frame 11 side, or at least on the second lead-frame 12 side.

As shown in FIG. 3, it is preferable to establish partition walls 25 over the extension 102 of the first lead-frame 11. Since the extensions 102 are established near the gap region between the two lead-frames at the center of the package, it is easy to separate device mounting regions inside package cavities, for example equally, via partition walls 25, and this allows desirable luminance distribution characteristics to be obtained. Further, the partition walls 25 can effectively suppress lead-frame delamination from the molded resin 20 by acting in a manner that holds down the lead-frame extensions 102.

As shown in FIG. 3, the partition walls 25 include a first partition wall and a second partition wall that straddle the tops of the extensions 102 of the first and second lead-frames 11, 12. The upper surfaces of the extensions 102 of the first and second lead-frames 11, 12 are partitioned into three regions by the first and second partition walls. Cavity interiors are divided in the longitudinal x-direction into three regions, which are a left-side region, a center region, and a right-side region. Accordingly, the upper surfaces of the ends of the extensions 102 of the first and second lead-frames 11, 12 are exposed in the left-side region and the right-side region respectively. Wires 40 connected to the light emitting elements 30 are connected to the end of each extension 102. While this avoids bonding wires 40 that straddle (over the tops of) partition walls 25, it can connect the light emitting elements 30 in parallel with relatively short bonding wires 40. Further, a protection device 70 is disposed in the cavity center region. By establishing the first and second partition walls 25 in a manner surrounding the protection device 70, light reduction due to the protection device 70 and its associated bonding wire 40 can be alleviated and light extraction efficiency can be improved. In the case where a bonding wire 40 straddles a partition wall 25, it is desirable to make the partition wall 25 height smaller than the cavity depth. However, when partition wall 25 straddling can be avoided, it is preferable to make partition walls approximately the same height as the upper surface of the molded resin 20 (i.e. the upper surfaces of the cavity side-walls 23).

Note that partition walls 25 can also be used in the light emitting device packages for other modes of implementation. For example, a partition wall 25 can be established approximately in the center of the package 100 for the first mode of implementation. In the package 120 for the second mode of implementation, for example, partition walls 25 can be established approximately in the center of the third lead-frame 13 (approximately in the center of the first extension 102 of the first lead-frame) and approximately in the center of the fifth lead-frame 15 (approximately in the center of the second extension 102 of the first lead-frame). Further, the protection device 70 and associated bonding wire 40 can be filled with a partition wall 25.

<Fourth Mode of Implementation>

Figure 4A:
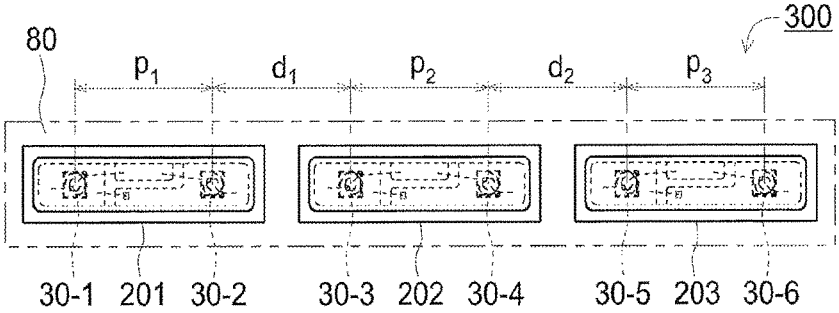
FIG. 4A is an abbreviated top view showing one example of light emitting device layout in an illumination device for an implementation of the present invention.
Figure 4B:
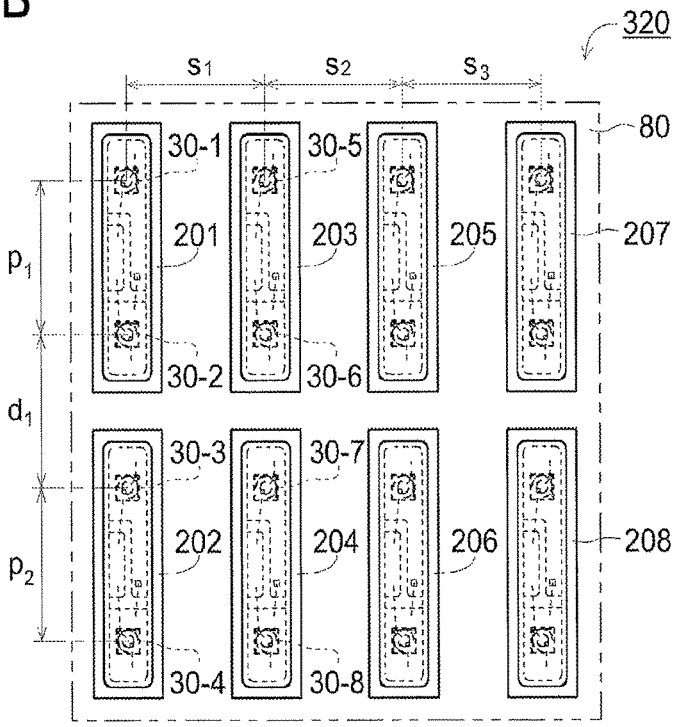
FIG. 4B is an abbreviated top view showing another example of light emitting device layout in an illumination device for another implementation of the present invention.

FIGS. 4A and 4B are abbreviated plan views showing examples of the layout of light emitting devices for illumination devices of the fourth mode of implementation. The illumination devices shown in FIGS. 4A and 4B are provided with a plurality of light emitting devices and substrate material on which the light emitting devices are mounted. The light emitting devices are surface mounted on the substrate material using conducting mounting adhesive.

The illumination device 300 example shown in FIG. 4A has a plurality of light emitting devices 201-203 arranged in a one-dimensional array (arranged in a line) on substrate material 80. More specifically, the illumination device 300 has three light emitting devices 201, 202, 203 lined up lengthwise at approximately equal intervals. The illumination device 320 example shown in FIG. 4B has a plurality of light emitting devices 201-208 arranged in a two-dimensional array (arranged in rows and columns) on substrate material 80. More specifically, the illumination device 320 has eight light emitting devices 201-208 arranged at approximately equal intervals in two rows and four columns with the package longitudinal direction aligned in the column direction and the transverse direction aligned in the row direction. Although any type of light emitting device (e.g. any commonly known light emitting device) can be used for the light emitting devices 201-208 in these illumination devices 300, 320, it is preferable to use the light emitting devices of the present invention (e.g. light emitting devices 200, 220, 230 of the first, second, and third modes of implementation). Note the number of light emitting devices mounted in a single illumination device and the number of light emitting elements mounted in a single light emitting device are set here only as one example.

As shown in FIGS. 4A and 4B, the distance $d_1$ in the longitudinal direction of the package between the first light emitting element 30-2 in the first light emitting device 201 (disposed closest to the second light emitting device 202) and the second light emitting element 30-3 in the second light emitting device 202 (disposed closest to the first light emitting device 201) is approximately equal to the distance $p_1$ between the first light emitting element 30-2 in the first light emitting device 201 and the adjacently disposed third light emitting element 30-1. This is designed to achieve an approximately uniform luminance distribution across adjacently disposed light emitting devices. In the example of FIG. 4B, the distance $s_1$ in the transverse direction of the package between the first light emitting element 30-2 (or the third light emitting element 30-1) in the first light emitting device 201 and the sixth light emitting element 30-6 (or the fifth light emitting element 30-5) in the third light emitting device 203 is approximately equal to the distance $d_1$. Note that the distances $s_2$ and $s_3$ for adjacently arrayed light emitting devices are also made equal to the distance $d_1$.

Also as shown in FIGS. 4A and 4B, the distance $p_1$ in the longitudinal direction of the package between the light emitting elements 30-1, 30-2 in the first light emitting device 201 is approximately equal to the distance $p_2$ between the light emitting elements 30-3 and 30-4 in the second light emitting device 202. This allows the light emitting elements to be regarded as equally distributed in those light emitting devices although a plurality of light emitting elements are carried in the different packages of the light emitting devices. As a result, the luminance distribution of the illumination device can be made more uniform.

So that the light emitting elements mounted in different light emitting devices can be considered to be disposed at equal intervals over the surface of the substrate material, it is desirable to make the interval between light emitting elements in each light emitting device relatively large. However, if the distance between the light emitting elements in the same light emitting device is made large, there is a tendency to form long bonding wires to connect the light emitting elements and protection device. Since the light emitting device of the present invention allows the bonding wires connecting the light emitting elements and protection device to be made relatively short, it can be used to advantage in this type of illumination device. Further, since the present invention can control uneven conducting mounting adhesive application and achieve a high degree of package self-alignment, undesirable package rotation and inclined mounting are suppressed, and thus light emitting devices can be mounted in proper orientation on the substrate material. This achieves superior accuracy for positioning light emitting devices (and, consequently, light emitting elements), and makes it easy to achieve precise light distribution characteristics.

The following describes each structural element of the light emitting device package, light emitting device, and illumination device of the present invention.

(Lead-frames 11, 12, 13, 14, 15)

Metal materials that can conduct electricity and can be connected with the light emitting elements and protection device can be used as the lead-frames. Specifically, metals such as copper, aluminum, gold, silver, tungsten, iron (steel), nickel, cobalt, molybdenum, alloys of those metals, copper-iron alloy, and phosphor bronze can be used in sheet metal form processed by various methods such as press-forming, etching, and metal rolling. In addition, metal plating or light reflecting thin-film can be established on the surface of those metals with materials such as silver, aluminum, rhodium, gold, copper, and their alloys. Among those materials, silver, which has the best light reflecting characteristics, is preferable. Although lead-frame thickness can be freely selected, for example, it is greater than or equal to 0.1 mm and less than or equal to 1 mm, and preferably greater than or equal to 0.2 mm and less than or equal to 0.4 mm. As shown in FIGS. 1A-1C for example, grooves and recesses can be formed in perimeter regions of the upper and lower surfaces of the lead-frames that make contact with the molded resin. This can restrain the ingress of ambient moisture and/or flux included in the conducting mounting adhesive, and can improve intimate contact between the molded resin and the lead-frames.

(Molded Resin 20)

The base material (matrix) of the molded resin can be a thermosetting resin such as polybismaleimide-triazine resin, epoxy resin, silicone resin, denatured silicone resin, silicone-based resin, polyimide resin, or polyurethane resin. Or, the base material can be a thermoplastic resin such as aliphatic polyamide resin, semi-aromatic polyamide resin, polyethylene terephthalate, polycyclohexane terephthalate, liquid crystal polymer, polycarbonate resin, syndiotactic polystyrene, polyphenylene-ether, polyphenylene-sulfide, polyether-sulfone resin, polyether-ketone, or polyarylate resin. In addition, particulate or fiber fillers and pigments such as glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, calcium titanate, aluminumborate, aluminum oxide, silicon carbide, antimony oxide, zinc stannate, zinc borate, iron oxide, chrome oxide, manganese oxide, and carbon black can be mixed into the base material.

(Light Emitting Elements 30)

Light emitting semiconductor devices such as light emitting diodes (LEDs) and semiconductor laser diodes can be used as the light emitting elements. A light emitting element can be any of a variety of semiconductor structures configured with a pair of positive and negative electrodes. In particular, nitride semiconductor light emitting elements (e.g. $In_xAl_yGa_{1-x-y}N$, $0 \leq x$, $0 \leq y$, $x+y \leq 1$) that can efficiently excite fluorescent material are preferable. In addition, the light emitting elements can be gallium arsenide based or gallium phosphide based semiconductors that emit light from green to red wavelengths. For light emitting elements with the positive and negative electrodes established on the same side of the chip, the chip is mounted with the electrode surface up and with bonding wires connecting each electrode to a lead-frame. For light emitting elements with an opposing electrode structure having electrodes established on the top and bottom surfaces of the chip, the bottom side electrode is connected to a lead-frame via conducting adhesive (die-attach) and the upper surface electrode is connected to a lead-frame via a bonding wire. This is the same as the mounting configuration of the protection device described later. Further, light extraction efficiency can be improved by establishing a metal layer such as silver or aluminum, or a light-reflecting dielectric layer on the die-attachment surface side of the light emitting element. A single light emitting element or a plurality of light emitting elements can be mounted in a single light emitting device package, and the size, shape, and light emission wavelength of the light emitting elements can be selected freely. A plurality of light emitting elements can be connected in series or parallel via the lead-frames and/or bonding wires. Further, a combination of different wavelength light emitting elements such as one blue light emitting element and one red light emitting element (two element), one blue light emitting element and one green light emitting element (two element), or one blue light emitting element, one green light emitting element, and one red light emitting element (three element) combination can also be mounted in a single light emitting device package.

(Wires 40)

The bonding wires are conducting wires that connect light emitting element and protection device electrodes with the lead-frames. Specifically, metal wire including gold, copper, silver, platinum, aluminum, and alloys of those metals can be used. In particular, gold wire, which can withstand stress applied by the encapsulating material without breaking and is superior with respect to characteristics such as thermal resistance, is preferable. Further, to improve light reflection characteristics, the bonding wires can be configured with silver at least on the surface.

(Encapsulating Material 50)

The encapsulating material is material that encapsulates the light emitting elements, protection device, bonding wires etc. and protects them from dust (particulates), moisture, and external forces. The base material of the encapsulating material can be material that is electrically insulating and can transmit light emitted by the light emitting elements (preferably with a light transmissivity greater than or equal to 70%). Specifically, silicone resin, epoxy resin, phenol resin, polycarbonate resin, acrylic resin, polymethyl-pentene resin (Mitsui Chemical brand name: TPX resin), polynorbornene resin, modified (denatured) resin derived from those resins, or hybrid resin including one or more of those resins can be used. Glass can also be used. Of those materials, silicone resin has superior ability to withstand heat and light, shows little post-hardening volume reduction, and is preferable. The encapsulating material can also have particles with various functions such as filler and fluorescent material added into the base material. Filler can be material such as light dispersing agents or coloring pigments. Specifically, filler can be silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, and carbon black. Filler particles can be round or crushed with arbitrary shape, and the encapsulating material can include hollow regions or can be porous.

(Fluorescent Material 60)

The fluorescent material absorbs at least part of the (primary beam of) light emitted from the light emitting element and re-emits (secondary) light at a wavelength different from that of the primary beam. For example, the fluorescent material can be nitride and oxy-nitride system fluorescent materials primarily activated by lanthanoid-group rare earth elements such as europium and cerium. More specifically, the fluorescent material can be substances such as europium-activated $\alpha$ or $\beta$-sialon fluorescent material, various alkaline earth metal nitride silicate fluorescent materials, lanthanoid-group elements such as europium, alkaline earth metal halogen-apatite fluorescent materials primarily activated by transition metal group elements such as manganese, alkaline earth halo-silicate fluorescent materials, alkaline earth metal silicate fluorescent materials, alkaline earth metal halogen borate fluorescent materials, alkaline earth metal aluminate fluorescent materials, alkaline earth metal silicates, alkaline earth metal sulfides, alkaline earth metal thiogallates, alkaline earth metal silicon nitride, germinate, rare earth element aluminates primarily activated by lanthanoid-group elements such as cerium, and organic and organic complex materials primarily activated by rare earth element silicates or lanthanoid-group elements such as europium. Fluorescent materials other than those listed above but having similar functionality and effect can also be used. This allows realization of a light emitting device that outputs a combination of visible wavelength primary light mixed with secondary emitted colors (e.g. for white light output), or a light emitting device with fluorescent material excited by ultraviolet primary light that outputs secondary light at visible wavelengths. Here, the fluorescent material can be settled towards the bottom of the package cavity or dispersed throughout the cavity.

(Protection Device 70)

The protection device is a device to protect the light emitting elements from static (electricity) discharge and high-voltage surge. Specifically, the protection device can be a Zener diode. To suppress protection device light absorption, it can be covered with reflective material such as a white resin.

(Substrate Material 80)

The substrate material is the material on which the light emitting devices (light emitting device packages) are mounted. Specifically, the substrate material can be any of various circuit boards. The primary constituents of the circuit board substrate can be ceramics such as aluminum oxide (alumina) and aluminum nitride, metals such as copper and aluminum, and resins (including fiber reinforced resins) such as glass-epoxy, BT (bismaleimide-triazine) resin, and polyimide resin. Metal run or wire material can be copper, iron (steel), nickel, tungsten, chrome, aluminum, silver, gold, titanium and alloys of those metals. The metal run circuitry has lands (surface mounting regions) to mount the light emitting devices using conducting mounting adhesive. Preferably, the pattern of metal run lands takes on approximately the same shape as the exposed regions of the bottom surfaces of the light emitting device lead-frames. This can suppress uneven conducting mounting adhesive application and improve light emitting device self-alignment.

(Conducting Mounting Adhesive)

The conducting mounting adhesive is material for surface mounting light emitting devices on the substrate material. Specifically, conducting mounting adhesive can be solder such as tin-bismuth, tin-copper, tin-silver, and gold-tin systems, or it can be metal paste (adhesive) that includes metals such as silver, gold, and palladium.

[Embodiment]

The following is a detailed description of an embodiment of the present invention. However, it should go without saying that the present invention is not limited only to the embodiment below.

<First Embodiment>

The light emitting device for the first embodiment is a (top-view) surface mount device (SMD) light emitting diode (LED) having the structure of the light emitting device 200 example shown in FIGS. 1A-1C.

The package 100 has a (solid) rectangular shape 7.0 mm in length, 2.0 mm in width, and 0.6 mm in thickness. The package 100 has first and second lead-frames 11, 12 that make up the positive and negative electrodes and a third lead-frame between those lead-frames all formed as a single-piece with molded resin 20. Packages 100 are fabricated by loading a pre-processed sheet-metal plate, which has a plurality of lead-frame 11, 12, 13 groups connected by support structure leads (that form support structures 104 stubs after singulation) in a two-dimensional array, inside a mold cavity. Material that forms the molded resin 20 is introduced into the mold cavity in liquid form and hardened. After removal from the mold, each package is separated from the rest (singulated).

Each of the three lead-frames 11, 12, 13 is a small piece of copper alloy sheet-metal with a silver plated surface and a maximum thickness of 0.3 mm. The first lead-frame 11 is made up of a rectangular (as viewed from above) main body 101 with a 2.0 mm length and 1.5 mm width (neglecting support structure 104 stubs), and a rectangular (as viewed from above) extension 102 extending from the main body 101 towards the second lead-frame 12 with a 2.0 mm length and 0.6 mm width (neglecting support structure 104 stubs). The extension 102 is established on one side (in the transverse direction) of the main body 101 to give the first lead-frame 11 an L-shape (as viewed from above). The second lead-frame 12 is formed in a rectangular shape (as viewed from above) with a 2.0 mm length and 1.5 mm width (neglecting support structure 104 stubs). The third lead-frame 13 is disposed opposite the extension 102 of the first lead-frame 11 in the transverse direction, and is formed in a rectangular shape (as viewed from above) with a 1.8 mm length and 0.6 mm width (neglecting support structure 104 stubs). The width of the gap region (in the longitudinal direction) between the extension 102 of the first lead-frame 11 and the second lead-frame 12 is 0.5 mm. The width of the gap region (in the longitudinal direction) between the main body 101 of the first lead-frame 11 and the third lead-frame 13 is also 0.5 mm. Further, the width of the gap region (in the transverse direction) between the extension 102 of the first lead-frame 11 and the third lead-frame 13 is 0.4 mm. These gap regions are punched-out by press-processing sheet-metal. A recess 103 is established in the bottom surface of the first lead-frame 11 extension 102 immediately adjacent to the main body 101 with a 0.5 mm length, 0.6 mm width, and 0.15 mm depth. The recess 103 is filled with molded resin 20. This separates essentially the entire exposed region 107 of the bottom surface of the extension from the exposed region 105 of the bottom surface of the main body of the first lead-frame 11 with molded resin 20 filling the recess 103. In addition, recesses having a depth of 0.09 mm are formed around part of the perimeters of the bottom surfaces of the first and second lead-frames 11, 12 and around the entire perimeter of the bottom surface of the third lead-frame 13. These recesses are formed by etching and are also filled with molded resin 20. The exposed regions of the bottom surfaces of the three lead-frames are in practice coplanar with the bottom surface of the molded resin 20 and form the bottom surface of the package 100. Further, the exposed regions of the bottom surfaces of the three lead-frames have rectangular shapes (with rounded corners). Part of the ends of both the first and second lead-frames 11, 12 (which are also support structure 104 stubs) are exposed from the ends of the package 100 in the longitudinal direction. Recesses are formed in a continuous manner on the bottom surfaces at these exposed regions and function as castellations.

The molded resin 20 is epoxy resin that includes titanium oxide molded into a rectangular shape (as viewed from above) with a length of 7.0 mm, a width of 2.0 mm, and a maximum thickness of 0.45 mm. A cavity having a rectangular shape (with rounded corners) is formed approximately in the center of the upper surface of the molded resin 20 with a length of 6.4 mm, width of 1.4 mm, and depth of 0.35 mm. The surfaces of the side-walls are inclined 5° to 30°. Grooves with a width of 0.12 mm and a depth of 0.09 mm are formed in the upper surfaces of the three lead-frames 11, 12, 13 along parts of the boundaries between the bottom of the cavity and the surfaces of the side-walls, and those grooves are filled with the molded resin 20.

A light emitting element 30 is mounted with silicone resin insulating mounting adhesive (die-attach) on the upper surface of each of the first and second lead-frames 11, 12 that form the bottom of the cavity in the package 100. Each light emitting element 30 is a nitride semiconductor light emitting diode (LED) chip with an n-type layer, an active layer, and a p-type layer formed in that order on a sapphire substrate. The LED chip can output blue light (with a center wavelength of 460 nm) and has dimensions 650 μm by 650 μm by 150 μm. The distance between the centers of the two light emitting element 30 die is 4.0 mm. One of the (p or n) electrodes is connected via a bonding wire 40 to the lead-frame that the chip is mounted on, and the other (p or n) electrode is connected via a bonding wire 40 to the upper surface of the third lead-frame 13. This connects the two light emitting elements 30 in series. The bonding wires 40 are 25 μm diameter gold bonding wire.

Further, a 150 μm by 150 μm by 85 μm Zener diode protection device 70 die with opposing electrode structure (electrodes on the top and bottom surfaces) is mounted with silver mounting adhesive (conducting die-attach) on the upper surface of the extension 102 of the first lead-frame 11. The upper surface electrode of the protection device 70 is connected to the upper surface of the second lead-frame 12 via a bonding wire 40.

The package 100 cavity with the two light emitting elements 30 and protection device 70 mounted inside is filled with encapsulating material 50 that covers each of the dies. The encapsulating material 50 includes silicone as a base material, cerium activated yttrium-aluminum-garnet (YAG:Ce) fluorescent material 60 and silica as filler. The upper surface of the encapsulating material 50 is approximately in the same plane as the upper surface of the molded resin cavity side-walls 23 making an essentially planar upper surface. The encapsulating material 50 is dispensed into the package 100 cavity in a fluid state and solidified by heating. The fluorescent material 60 settles towards the bottom of the cavity.

The package and light emitting device configured as described above for the first embodiment can have the same effect as the package 100 and light emitting device 200 for the first mode of implementation.

The light emitting device package of the present invention can be used with good results as a surface mount device (SMD) light emitting diode (LED) package. A light emitting device using the package of the present invention can be used in applications such as liquid crystal display backlighting, various illumination and lighting equipment, large-scale displays, and various display apparatus such as signs for advertisement and destination information. The light emitting device can also be used in image acquisition equipment such as digital video cameras, facsimile (FAX) machines, copy machines, and scanners, as well as in projectors. It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2012-289198 filed in Japan on Dec. 29, 2012, the content of which is incorporated herein by reference.

What is claimed is:

1. A light emitting device comprising:

[a] light emitting [element] *elements*; and a light emitting device package having a longitudinal direction as viewed from above and a transverse direction perpendicular to the longitudinal direction, the light emitting device package comprising:

[a] first and second [lead-frame] *lead-frames* lined-up in the longitudinal direction; and molded resin holds the first and second lead-frames integrally, wherein the first lead-frame comprises:

a main body; and an extension from the main body that extends with a narrowed width towards the second lead-frame, wherein a recess is established in the bottom surface of the first lead-frame, wherein at least part of [the] *an* exposed region of the bottom surface of the extension is separated from [the] *an* exposed region of the bottom surface of the main body by the molded resin that fills the recess, and wherein [the] *a* light emitting element *of the light emitting elements* is mounted on each upper surface of the first and second lead-frames.

2. The light emitting device as recited in claim 1, wherein approximately the entire exposed region of the bottom surface of the extension is separated from the exposed region of the bottom surface of the main body by the molded resin that fills the recess.

3. The light emitting device as recited in claim 1, wherein the exposed region of the bottom surface of the extension has an approximately rectangular shape.

4. The light emitting device as recited in claim 1, wherein the extension is positioned approximately in the center of the light emitting device package.

5. The light emitting device as recited in claim 1 further comprising a third lead-frame disposed opposite the extension in the transverse direction, wherein at least part of the bottom surface of the third lead-frame is exposed from the molded resin.

6. The light emitting device as recited in claim 1, wherein the second lead-frame has a main body and an extension from the main body that extends with a narrowed width towards the first lead-frame, wherein a recess is established in the bottom surface of the second lead-frame, wherein at least part of the exposed region of the bottom surface of the extension of the second lead-frame is separated from the exposed region of the bottom surface of the main body by the molded resin that fills the recess in the second lead-frame, and wherein the extensions of the first and second lead-frames are disposed opposite each other in the transverse direction.

7. The light emitting device as recited in claim 1, wherein the molded resin exposes at least part of the upper surface of the main body of the first lead-frame and at least part of the upper surface of the extension of the first lead-frame that extends towards the second lead-frame at the top of the light emitting device package, and wherein the molded resin comprises partition walls that are established extending in the transverse direction.

8. The light emitting device as recited in claim 7, wherein partition walls are established on top of the extension of the first lead-frame.

9. The light emitting device as recited in claim 8, wherein the second lead-frame has a main body and an extension from the main body that extends with a narrowed width towards the first lead-frame, wherein the extensions of the first and second lead-frames are disposed opposite each other in the transverse direction, wherein the partition walls include a first partition wall and a second partition wall that straddle the tops of the extensions of the first and second lead-frames, and wherein the upper surface of each of the extensions of the first and second lead-frames are partitioned into three regions by the first and second partition walls.

10. The light emitting device as recited in claim 1 provided with a protection device mounted on the upper surface of the extension of the first lead-frame.

11. An illumination device having first and second light emitting devices, which are light emitting devices as recited in claim 1, lined-up in the longitudinal direction;

wherein the first light emitting device has [the] *a* first light emitting element *of the light emitting elements* disposed closest to the second light emitting device, wherein the second light emitting device has [the] *a* second light emitting element *of the light emitting elements* disposed closest to the first light emitting device, wherein the first light emitting device has [the] *a* third light emitting element *of the light emitting elements* disposed adjacent to the first light emitting *element*, and wherein the distance between the first light emitting element and the second light emitting element is approximately equal to the distance between the first light emitting element and the third light emitting element.

12. The illumination device as recited in claim 11, wherein the distance between light[:] emitting elements adjacently disposed in the first light emitting device is approximately equal to the distance between light emitting elements adjacently disposed in the second light emitting device.

13. The light emitting device [package] as recited in claim 2, wherein the exposed region of the bottom surface of the extension has an approximately rectangular shape.

14. The light emitting device as recited in claim 13, wherein the extension is positioned approximately in the center of the light emitting device package.

15. The light emitting device as recited in claim 14 further comprising a third lead-frame disposed opposite the extension in the transverse direction, wherein at least part of the bottom surface of the third lead-frame is exposed from the molded resin.

16. The light emitting device as recited in claim 15, wherein the second lead-frame has a main body and an extension from the main body that extends with a narrowed width towards the first lead-frame, wherein a recess is established in the bottom surface of the second lead-frame, wherein at least part of the exposed region of the bottom [suffice] *surface* of the extension of the second lead-frame is separated from the exposed region of the bottom surface of the main body by the molded resin that fills the recess in the second lead-frame, and wherein the extensions of the first and second lead-frames are disposed opposite each other in the transverse direction.

17. The light emitting device as recited in claim 16 provided with a protection device mounted on the upper surface of the extension of the first lead-frame.

18. An illumination device having first and second light emitting devices, which are light emitting devices as recited in claim 16, lined-up in the longitudinal direction;

wherein the first light emitting device has [the] *a* first light emitting element *of the light emitting elements* disposed closest to the second light emitting device, wherein the second light emitting device has [the] *a* second light emitting element *of the light emitting elements* disposed closest to the first light emitting device, wherein the first light emitting device has [the] *a* third light emitting element *of the light emitting elements* disposed adjacent to the first light emitting *element*, and wherein the distance between the first light emitting element and the second light emitting element is approximately equal to the distance between the first light emitting element and the third light emitting element.

19. A light emitting device package having a longitudinal direction as viewed from above and a transverse direction perpendicular to the longitudinal direction comprising:

[a] first and second [lead-frame] *lead-frames* lined-up in the longitudinal direction; and molded resin holds the first and second lead-frames integrally, wherein the first lead-frame comprises:

a main body; and an extension from the main body that extends with a narrowed width towards the second lead-frame, wherein a recess is established in the bottom surface of the first lead-frame, wherein at least part of [the] *an* exposed region of the bottom surface of the extension is separated from [the] *an* exposed region of the bottom surface of the main body by the molded resin that fills the recess, wherein the molded resin exposes at least part of the upper surface of the main body of the first lead-frame and at least part of the upper surface of the extension of the first lead-frame that extends towards the second lead-frame at the top of the light emitting device package, wherein the molded resin comprises partition walls that are established extending in the transverse direction, wherein partition walls are established on top of the extension of the first lead-frame, wherein the second lead-frame has a main body and an extension from the main body that extends with a narrowed width towards the first lead-frame, wherein the extensions of the first and second lead-frames are disposed opposite each other in the transverse direction, wherein the partition walls include a first partition wall and a second partition wall that straddle the tops of the extensions of the first and second lead-frames, and wherein the upper surface of each of the extensions of the first and second lead-frames are partitioned into three regions by the first and second partition walls.

20. A light emitting device comprising:

a light emitting device package as recited in claim 19;

a light emitting element mounted on each upper surface of the first and second lead-frames; and a protection device mounted on the upper surface of the extension of the first lead-frame.

*21. An illumination device comprising:*

*first and second light emitting devices, which are lined-up in a longitudinal direction,*

*wherein the first and second light emitting devices comprise:*

*light emitting elements including first, second and third light emitting elements,*

*wherein each of the first and second light emitting devices comprises:*

*first and second lead-frames lined-up in the longitudinal direction; and*

*molded resin holding the first and second lead-frames integrally,*

*wherein the first light emitting device comprises:*

*the first light emitting element mounted on an upper surface of the first lead-frame; and*

*the third light emitting element mounted on an upper surface of the second lead-frame,*

*wherein the second light emitting device comprises:*

*the second light emitting element mounted on an upper surface of the first or second lead-frame,*

*wherein the first and second lead-frames have a gap region that separates the first and second lead-frames, the gap region being filled with the molded resin,*

*wherein the first light emitting element is disposed closest to the second light emitting device,*

*wherein the second light emitting element is disposed closest to the first light emitting device,*

*wherein the third light emitting element is disposed adjacent to the first light emitting element, and*

*wherein a distance between the first light emitting element and the second light emitting element is equal to a distance between the first light emitting element and the third light emitting element.*

*22. The illumination device as recited in claim 21, wherein the molded resin is a thermosetting resin member surrounding the first light emitting element in a plan view.*

*23. The illumination device as recited in claim 21,*

*wherein the distance between the first light emitting element and second light emitting element is longer than total of:*

*a distance between the first light emitting element and a first side surface of the first light emitting device, the first side surface being adjacent to the second light emitting device; and*

*a distance between the second light emitting element and a second side surface of the second light emitting device, the second side surface being adjacent to the first light emitting device.*

*24. The illumination device as recited in claim 21, further comprising a substrate material on which the first light emitting device and second light emitting device are mounted thereon.*

*25. The illumination device as recited in claim 21, wherein the number of light emitting devices is more than three.*

*26. The illumination device as recited in claim 21, wherein each light emitting device comprises fluorescent material.*

*27. The illumination device as recited in claim 26, wherein the fluorescent material is positioned on or above one of the light emitting elements of one of the light emitting devices, and a concentration of the fluorescent material around a top area of the one of the light emitting devices is lighter than that of the fluorescent material around a top area of the one of the light emitting elements.*

*28. The illumination device as recited in claim 21, wherein the plurality of the light emitting devices is arranged in a two-dimensional array.*

*29. The illumination device as recited in claim 22, wherein the molded resin surrounds the first light emitting element and a member holding fluorescent material.*

*30. The illumination device as recited in claim 21, wherein the illumination device is for liquid crystal display backlighting.*

*31. The illumination device as recited in claim 22, wherein the illumination device is for liquid crystal display backlighting.*

*32. The illumination device as recited in claim 31, wherein each light emitting device comprises fluorescent material.*

*33. The illumination device as recited in claim 32, wherein the molded resin surrounds the first light emitting element and a member holding the fluorescent material.*

*34. The illumination device as recited in claim 33, wherein the fluorescent material is positioned on or above one of the light emitting elements of one of the light emitting devices, and a concentration of the fluorescent material around a top area of the one of the light emitting devices is lighter than that of the fluorescent material around a top area of the one of the light emitting elements.*

* * * * *